(12) United States Patent
Huang et al.

(10) Patent No.: US 10,374,625 B2
(45) Date of Patent: Aug. 6, 2019

(54) CAPACITOR LAYOUT OF DIGITAL-TO-ANALOG CONVERSION INTEGRATED CIRCUIT

(71) Applicant: REALTEK SEMICONDUCTOR CORPORATION, Hsinchu (TW)

(72) Inventors: Shih-Hsiung Huang, Miaoli County (TW); Sheng-Hsiung Lin, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/855,149

(22) Filed: Dec. 27, 2017

(65) Prior Publication Data
US 2018/0337688 A1    Nov. 22, 2018

(30) Foreign Application Priority Data
May 19, 2017   (TW) .............................. 106116780 A

(51) Int. Cl.
*H03M 1/66*    (2006.01)
*H03M 1/80*    (2006.01)
(Continued)

(52) U.S. Cl.
CPC ............. *H03M 1/802* (2013.01); *H03M 1/68* (2013.01); *H03M 1/468* (2013.01)

(58) Field of Classification Search
CPC ........ H03M 1/468; H03M 1/466; H03M 1/38; H03M 1/462; H03M 1/145; H03M 1/069; H03M 1/804; H03M 1/403; H03M 1/0682
(Continued)

(56) References Cited

U.S. PATENT DOCUMENTS 5,973,633 A * 10/1999 Hester .................. H01L 27/101
257/E27.071
6,016,019 A *  1/2000 Wojewoda .......... H01L 27/0805
307/109
(Continued)

FOREIGN PATENT DOCUMENTS

TW        200803182        1/2008

OTHER PUBLICATIONS

Chun-Cheng Liu, et al., "A 1V 11fJ/Conversion-Step 10bit 10MS/s Asynchronous SAR ADC in 0.18µm CMOS", 2010 Symposium on VLSI Circuits/Technical Digest of Technical Papers.
(Continued)

*Primary Examiner* — Linh V Nguyen
(74) *Attorney, Agent, or Firm* — WPAT, PC

(57) ABSTRACT

The present invention discloses a capacitor layout of a digital-to-analog conversion integrated circuit (DAC IC), comprising a first capacitor group, a second capacitor group and a third capacitor group. The first capacitor group, located within an interior layout area of the capacitor layout, determines a most significant bit (MSB) of the DAC IC and includes a plurality of capacitor units coupled between a first upper circuit and a first lower circuit. The second capacitor group, located within the interior layout area, determines a non-MSB bit of the DAC IC and includes at least one capacitor unit(s) coupled between a second upper circuit and a second lower circuit. The third capacitor group includes a plurality of capacitor units coupled between a third upper circuit and a third lower circuit which are not short-circuited; the capacitor units of the third capacitor group are disposed around the interior layout area.

20 Claims, 8 Drawing Sheets

(51) Int. Cl.
  *H03M 1/68* (2006.01)
  *H03M 1/46* (2006.01)
(58) Field of Classification Search
  USPC .............................. 341/155, 172, 150, 144
  See application file for complete search history.

(56) References Cited

U.S. PATENT DOCUMENTS

| | | | | |
|---|---|---|---|---|
| 7,403,147 | B2* | 7/2008 | Klaassen | H03M 1/0612 |
| | | | | 341/144 |
| 7,554,789 | B2* | 6/2009 | Chen | H01L 23/5223 |
| | | | | 307/109 |
| 9,654,127 | B1* | 5/2017 | Lin | H03M 1/06 |
| 2005/0017321 | A1* | 1/2005 | Hakkarainen | H01L 27/0805 |
| | | | | 257/532 |
| 2010/0253563 | A1* | 10/2010 | Shetty | H03M 1/0612 |
| | | | | 341/150 |
| 2011/0001542 | A1* | 1/2011 | Ranta | H01L 27/1203 |
| | | | | 327/382 |
| 2012/0154194 | A1* | 6/2012 | Chang | H03M 1/002 |
| | | | | 341/158 |
| 2014/0049872 | A1* | 2/2014 | Huang | H01G 4/30 |
| | | | | 361/301.4 |
| 2015/0236711 | A1* | 8/2015 | Aruga | H01L 23/5225 |
| | | | | 341/150 |
| 2017/0365414 | A1* | 12/2017 | Tanaka | G01D 5/56 |

OTHER PUBLICATIONS

Chun-Cheng Liu, Student Member, IEEE, Soon-Jyh Chang, Member, IEEE, Guan-Ying Huang, Student Member, IEEE, and Ying-Zu Lin, Student Member, IEEE, "A 10-bit 50-MS/s SAR ADC With a Monotonic Capacitor Switching Procedure", IEEE Journal of Solid-State Circuits, vol. 45, No. 4, Apr. 2010.

Brian P. Ginsburg, Student Member, IEEE, and Anantha P. Chandrakasan, Fellow, IEEE, "500-MS/s 5-bit ADC in 65-nm CMOS With Split Capacitor Array DAC", IEEE Journal of Solid-State Circuits, vol. 42, No. 4, Apr. 2007.

Taiwan Intellectual Property Office, "Office Action", dated Sep. 28, 2018. Summary of the OA letter: Claims 1, 5-7 are rejected as being anticipated by TW 200803182A (also published as US7554789B2).

* cited by examiner

CAPACITOR LAYOUT OF DIGITAL-TO-ANALOG CONVERSION INTEGRATED CIRCUIT

BACKGROUND OF THE INVENTION

1. Field of the Invention

The present invention relates to an integrated circuit layout, especially to a capacitor layout of an integrated circuit.

2. Description of Related Art

Regarding a successive approximation register analog-to-digital conversion integrated circuit (SAR ADC IC), a digital-to-analog converter (DAC) plays an important role. A known type of the DAC is a capacitive DAC (CDAC). A CDAC uses a plurality of capacitor groups of different sizes (e.g., 256C, 128C, . . . , 4C, 2C, 1C, 1C, in which "C" is a designed unit of capacitance) through the control over switches to successively output a plurality of analog signals gradually approaching an input signal, and thus an SAR ADC IC can successively compare a sampled value of the input signal with the analog signals outputted by the CDAC to obtain digital bits of the input signal. The plurality of capacitor groups should match, which means that the ratio of the capacitance of one capacitor group to the capacitance of another capacitor group should be accurate/reliable, so as to allow the analog signals of the CDAC to be generated accurately for gradually approaching the input signal and make sure that each digital bit of the input signal is correct.

In light of the above, when manufacturing an IC (especially with an advanced process), the matching property of capacitor groups of a CDAC is dependent upon whether the layout (or circuit density) of the capacitor groups and their neighboring elements is uniform. Generally, the better the uniformity of the layout, the better the matching property. Therefore, As shown in FIG. 1 illustrating a conventional capacitor layout 100 of a CDAC, the capacitor groups are surrounded by dummy capacitors which ensures that the circuitry density of the edge of the layout of the capacitor groups (hereafter, the capacitor group layout) is similar to the circuitry density of the inside of the capacitor group layout, so as to make sure the matching property of actually manufactured capacitor groups would be reliable. In FIG. 1, different capacitor groups (i.e., capacitor group 4C, capacitor group 2C, and capacitor group 1C) are labeled with different numbers (4, 2, and 1) respectively, while the dummy capacitors are labeled with "D". In FIG. 1, the electrode circuits 110, 120 of each capacitor unit in the capacitor groups shouldn't be short-circuited so as to generate capacitance; meanwhile, the electrode circuits 130, 140 of each dummy capacitor should be short-circuited so as to prevent generating capacitance. However, as shown in FIG. 2, parasitic capacitance (as indicated by the dotted lines in FIG. 2) is generated between any two capacitor units in the capacitor groups while no substantial parasitic capacitance is generated between any capacitor unit at the edge of the capacitor group layout and any dummy capacitor. As a result, the effective capacitance of a capacitor unit at the edge of the capacitor group layout is substantially different from the effective capacitance of a capacitor unit at the inside of the capacitor group layout, and this difference will affect the correctness of digital-to-analog conversion. For example, the capacitance proportions of the capacitor groups (i.e., capacitor group 4C, capacitor group 2C, and capacitor group 1C) in FIG. 1 are supposed to be 4:2:1, but they are 18.66695:9.338976:4.670652 in reality due to the influence of the said parasitic capacitances. This deviation of the capacitance proportions leads to a bad linearity of the CDAC, and makes the CDAC unfavorable to a high definition application.

People who are interested in the prior art may refer to the following literature: Chun-Cheng Liu, et al., "A 1V 11fJ/Conversion-Step 10 bit 10 MS/s Asynchronous SAR ADC in 0.18 μm CMOS", 2010 Symposium on VLSI Circuits/Technical Digest of Technical Papers.

SUMMARY OF THE INVENTION

An object of the present invention is to provide a capacitor layout of a digital-to-analog conversion integrated circuit as an improvement over the prior art.

The present invention discloses a capacitor layout of a digital-to-analog conversion integrated circuit (DAC IC). An embodiment of the capacitor layout of the DAC IC includes a plurality of capacitor groups. The capacitor groups includes a first capacitor group, a second capacitor group and a third capacitor group. The first capacitor group is used for determining a first bit of the DAC IC, and includes M first capacitance units that are coupled between a first upper circuit and a first lower circuit and located within an interior layout area of the capacitor layout of the DAC IC, in which the M is an integer greater than one. The second capacitor group is used for determining a second bit of the DAC IC, and includes N second capacitance unit(s) that are coupled between a second upper circuit and a second lower circuit and located within the interior layout area, in which the N is a positive integer while the M is greater than the N. The third capacitor group includes X third capacitance units that are coupled between a third upper circuit and a third lower circuit, in which the third upper circuit and the third lower circuit are not short-circuited, the X third capacitance units are located outside the interior layout area and disposed next a plurality of sides of the interior layout area, and the X is an integer greater than one.

Another embodiment of the aforementioned capacitor layout of the DAC IC includes a plurality of capacitor groups. These capacitor groups includes: a first capacitor group for determining a first bit of the DAC IC, in which the first capacitor group is coupled between a first upper circuit and a first lower circuit and located within an interior layout area of the capacitor layout of the DAC IC; a second capacitor group for determining a second bit of the DAC IC, in which the second capacitor group is coupled between a second upper circuit and a second lower circuit and located within the interior layout area; and a third capacitor group coupled between a third upper circuit and a third lower circuit, in which the third upper circuit and the third lower circuit are not short-circuited, and the third capacitor group is located outside the interior layout area and disposed next a plurality of sides of the interior layout area.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a capacitor layout of a digital-to-analog conversion integrated circuit (DAC IC) such as a capacitive DAC IC. The DAC IC using the capacitor layout of the present invention is superior in linearity (e.g., lower differential nonlinearity (DNL) and lower integral nonlinearity (INL)) in comparison with the prior art.

The capacitor layout of the present invention has no need to dispose dummy capacitors at the periphery or the inside of the capacitor layout; however, this is not a limitation in the implementation of the present invention. The capacitor layout of the present invention disposes the capacitor group(s), which can tolerate capacitance variance, at the edge of the capacitor layout, and disposes the capacitor group(s) whose capacitance should be accurate at the inside (i.e., the place not adjacent to the edge) of the capacitor layout. Each capacitor group includes at least one capacitor unit(s) in the form of a metal-insulation-metal (MIM), poly-insulator-poly (PIP), etc. Each capacitor unit at the edge of the capacitor layout is coupled between two circuits (e.g., two electrode circuits) to provide capacitance, in which the two circuits should not be short-circuited so that the said each capacitor unit is not a dummy capacitor; in other words, the capacitor group(s) at the edge of the capacitor layout is/are designed to provide capacitance and participate(s) in generating bits of a DAC IC. However, the capacitor group(s) at the edge of the capacitor layout is/are not dominant in determining the bits of the DAC IC, so as to prevent the capacitance variance of the capacitor group(s) has significant influence on the generation of the bits of the DAC IC. Every capacitor unit in the capacitor layout is similar, or some capacitor unit is different from the others in design; people of ordinary skill in the art can design the capacitor units in the capacitor layout within their discretion.

Figure 3:
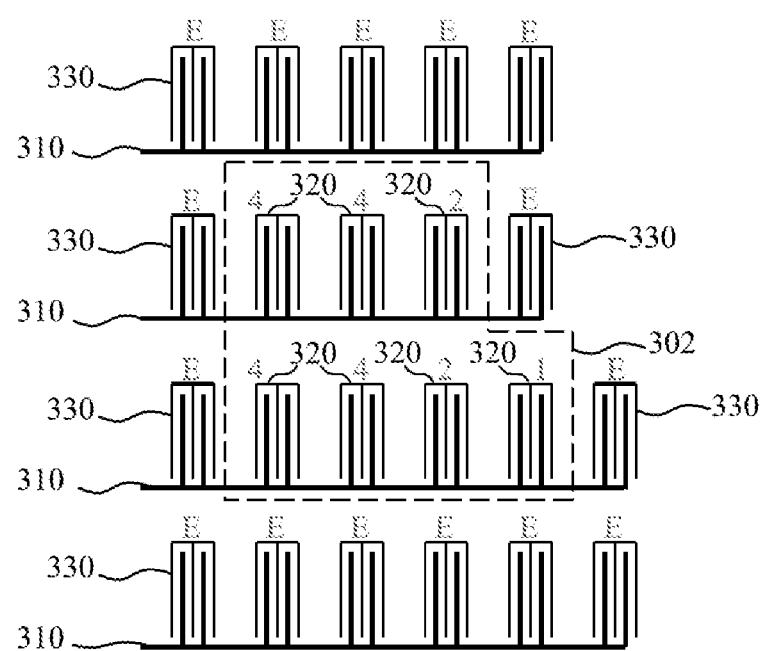
FIG. 3 shows a capacitor layout of a DAC IC according to an embodiment of the present invention.

FIG. 3 shows the capacitor layout of the DAC IC according to an embodiment of the present invention. As shown in FIG. 3, the capacitor layout 300 includes a plurality of capacitor groups; each of the capacitor groups includes at least one capacitor unit(s). In FIG. 3, the number of the capacitor groups and the number of the capacitor units in each capacitor group are exemplary for understanding, not for confining the implementation of the present invention. In FIG. 3, the capacitor groups (i.e., capacitor group 4C, capacitor group 2C, and capacitor group 1C, in which "C" is a designed unit of capacitance) among the whole capacitor groups for determining bits of the DAC IC are labeled with different numbers (i.e., 4, 2, and 1) and placed within an interior layout area 302; the capacitor group (i.e., capacitor group E) among the whole capacitor groups is placed along the border of the capacitor layout 300 and labeled with "E", and the capacitor group E is outside the interior layout area 302.

Please refer to FIG. 3. The whole capacitor groups includes the capacitor group 4C, the capacitor group 2C, the capacitor group 1C, and the capacitor group E. The capacitor group 4C is configured to determine a first bit (e.g., a most significant bit (MSB) or a secondary significant bit) of the DAC IC and includes a plurality capacitor units (e.g., M capacitor units, in which M is greater than one); each capacitor unit of the capacitor group 4C is coupled between an upper circuit 310 and a lower circuit 320, the upper circuit 310 is configured to receive an alternating current (AC) input signal, the lower circuit 320 includes a high voltage (e.g., reference voltage) supply circuit and a low voltage (e.g., ground voltage) supply circuit, and each capacitor unit of the capacitor groups 4C, 2C and 1C can be coupled to one of the high voltage supply circuit and the low voltage supply circuit. The capacitor group 2C is configured to determine a second bit (e.g., a secondary significant bit or a third significant bit) of the DAC IC and includes a plurality of capacitor units (e.g., P capacitor units, in which P is greater than one and less than M); each capacitor unit of the capacitor group 2C is coupled between the upper circuit 310 and the lower circuit 320 or between another upper circuit and another lower circuit in accordance with implementer's demand; in this embodiment, the number of the capacitor units in the capacitor group 2C is less than the number of the capacitor units in the capacitor group 4C. The capacitor group 1C is coupled between the upper circuit 310 and the lower circuit 320 or another upper circuit and another lower circuit in accordance with implementer's demand; in this embodiment, the number of the capacitor unit(s) in the capacitor group 1C is less than the number of the capacitor units in the capacitor group 2C. The capacitor group E includes a plurality of capacitor units (e.g., X capacitor units, in which X is greater than one); each capacitor unit of the capacitor group E is coupled between the upper circuit 310 and a voltage terminal (e.g., a ground terminal) 330, in which the upper circuit 310 and the voltage terminal 330 are not short-circuited so that the capacitor group E functions as a capacitor; the capacitor units of the capacitor group E are disposed around the interior layout area 302; and the capacitor group E is disposed at the outmost periphery of the capacitor layout 300 and has no need to be surrounded by dummy capacitors. In an alternative embodiment, the capacitor units of the capacitor group E are disposed next/along several sides (e.g., N sides, in which N is an integer greater than two) of the interior layout area 302 to completely or partially surround the interior layout area 302. In an alternative embodiment, the capacitor group E is coupled between another upper circuit and another voltage terminal according to implementer's demand. In an alternative embodiment, dummy capacitors are optionally introduced into the capacitor layout 300.

Figure 1:
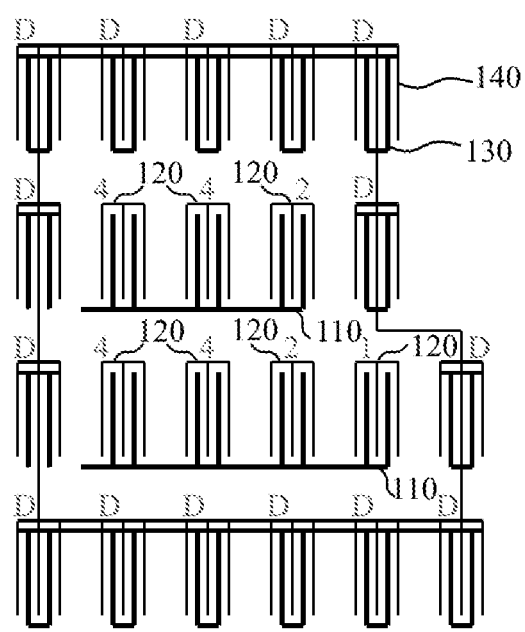
FIG. 1 shows a conventional capacitor layout of an integrated circuit according to a prior art.
Figure 2:
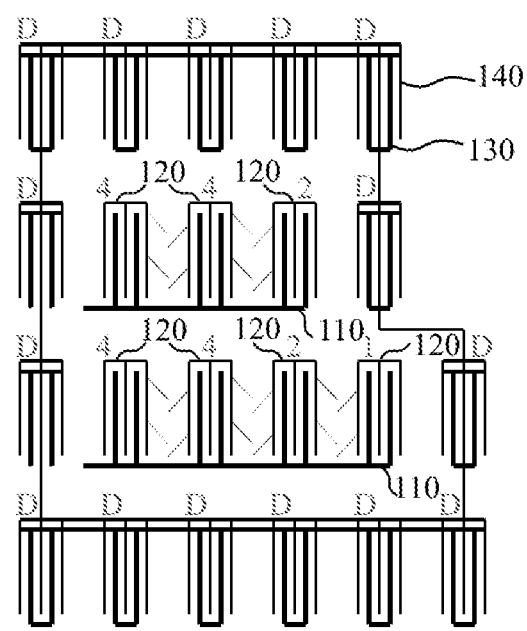
FIG. 2 shows the parasitic capacitance of the capacitor layout of FIG. 1.
Figure 4:
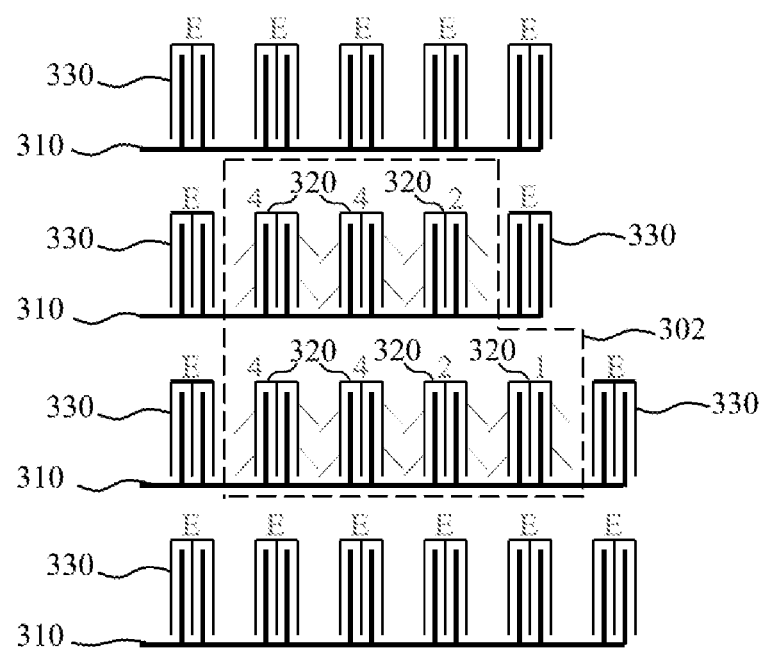
FIG. 4 shows the parasitic capacitance of the capacitor groups of FIG. 3 that are dominant in determining bits of the DAC IC.

FIG. 4 shows the parasitic capacitance of the capacitor groups of FIG. 3 (i.e., the capacitor group 4C, the capacitor group 2C, and the capacitor group 1C) that are dominant in determining bits of the DAC IC. As shown in FIG. 4, in the capacitor group 4C, the capacitor group 2C and the capacitor group 1C, the parasitic capacitance of each capacitor unit (as indicated by the dotted lines in FIG. 4) is similar to the parasitic capacitance of any of the other capacitor units. Therefore, the actual capacitance ratio of one capacitor group to another capacitor group will be proportional to the designed capacitance ratio of the said capacitor group to the said another capacitor group, which consequently prevent the problem of the prior art (as shown in FIG. 2).

Figure 5A:
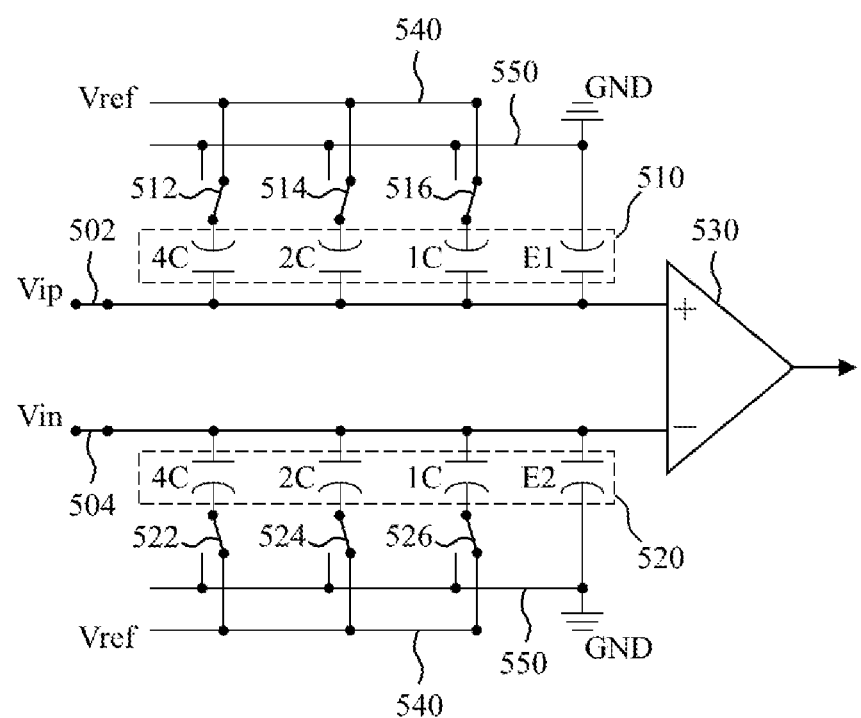
FIG. 5a shows a partial circuit diagram of a DAC IC using the capacitor layout of FIG. 3 according to an embodiment of the present invention.

FIG. 5a shows a partial circuit diagram of a DAC IC using the capacitor layout 300 of FIG. 3 according to an embodiment of the present invention. As shown in FIG. 5a, DAC IC 500 includes: a first capacitor-group set 510 using the capacitor layout 300 of FIG. 3; a second capacitor-group set 520 also using the capacitor layout 300 of FIG. 3; and a comparator 530. The first capacitor-group set 510 receives a positive input Vip of a differential signal through a switch 502, and includes a capacitor group 4C (having capacitance 4C), a capacitor group 2C (having capacitance 2C), a capacitor group 1C (having capacitance 1C), and a capacitor group $E_1$ (having capacitance $E_1C$). The second capacitor-group set 520 receives a negative input Vin of the differential signal through a switch 504, and includes a capacitor group 4C (having capacitance 4C), a capacitor group 2C (having capacitance 2C), a capacitor group 1C (having capacitance 1C), and a capacitor group $E_2$ (having capacitance $E_2C$). The first capacitor-group set 510 is coupled to the positive input terminal of the comparator 530, in which the capacitor group 4C, the capacitor 2C and the capacitor group 1C are coupled to one of a reference voltage (Vref) supply circuit 540 and a ground voltage (GND) supply circuit 550 through switches 512, 514 and 516 respectively, and the capacitor group $E_1$ is directly coupled to the ground voltage supply circuit 550. The second capacitor-group set 520 is coupled to the negative input terminal of the comparator 530, in which the capacitor group 4C, the capacitor 2C and the capacitor group 1C are coupled to one of the reference voltage (Vref) supply circuit 540 and the ground voltage (GND) supply circuit 550 through switches 522, 524 and 526 respectively, and the capacitor group $E_2$ is directly coupled to the ground voltage supply circuit 550. The said switches 502 and 504 are turned on (i.e., performing connection) during sampling operation and turned off (i.e., performing disconnection) after finishing the sampling operation, so as to allow the comparator 530 to execute comparison accordingly. Each of the said switches 512, 514, 516, 522, 524 and 526 is coupled to the reference voltage supply circuit 540 or the ground voltage supply circuit 550 in accordance with the comparison between the output signal of the comparator 530 and the sampled signal of the differential signal. Since the control and the operation of the said switches are known in this industrial field, the details are omitted.

Figure 5B:
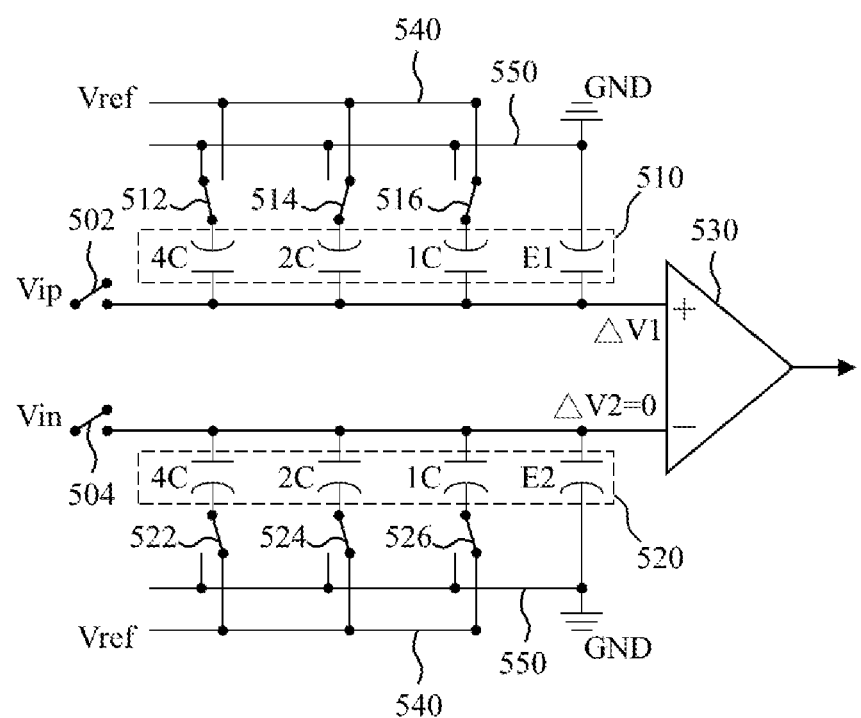
FIG. 5b shows the circuit of FIG. 5a executing a switching operation to generate a signal approaching a differential signal.

FIG. 5b shows the circuit of FIG. 5a executing a switching operation once to generate a signal approaching the aforementioned differential signal. As shown in FIG. 5b, based on an amplitude of the differential signal (e.g., an amplitude slightly larger than the amplitude of an analog signal equivalent to a binary digital value "100") and a set-and-down switching algorithm, if the switches 502, 504 performs disconnection to stop sampling the differential signal, the switch 512 is decoupled from the reference voltage supply circuit 540 and coupled to the ground voltage supply circuit 550 according to a former comparison result while the other switches keep being coupled to the reference voltage supply circuit 540. In consideration of charge conservation, the voltage variation $\Delta V1$ at the positive input terminal of the comparator 530 is as follows:

$$\Delta V1 = \frac{4C}{(4C+2C+1C+E1C)}(Vref - 0)$$

In the meantime, the voltage variation $\Delta V2$ at the negative input terminal of the comparator 530 is substantially zero (i.e., $\Delta V2=0$). Since the capacitor group $E_1$ is located at the edge of the capacitor layout 300 and vulnerable to the influence of uneven layout, providing the ideal capacitance of the capacitor group $E_1$ is 4C and the actual capacitance of the capacitor group $E_1$ is 3C, the error $\Delta V1_{error}$ $$\left(\text{i.e., } \frac{\text{actual } \Delta V1}{\text{ideal } \Delta V1} - 1\right)$$

of the voltage variation $\Delta V1$ is as follows:

$$\Delta V1_{error} = \frac{\frac{4C}{(7C+3C)}(Vref - 0)}{\frac{4C}{(7C+4C)}(Vref - 0)} - 1 = \frac{1}{10} = 10\%$$

In light of the above, providing the capacitor group 4C of the capacitor group $E_1$ is dominant in determining the MSB of the DAC IC, the error $\Delta V1_{error}$ will be the maximum error for executing the switching operation one time. Since people of ordinary skill in the art can appreciate how to derive $\Delta V1$ and $\Delta V1_{error}$ of other instances (e.g., instances with the differential signal of other amplitudes, instances with other amounts of capacitor groups, instances with capacitor groups having other capacitance, and/or instances with the lower circuit 320 being coupled to other reference voltage(s)) from the present disclosure, repeated and redundant description is omitted here. It should be noted that the set-and-down switching algorithm is well known in this industrial field as mentioned in the following literature: Chun-Cheng Liu, et al., "A 1V 11fJ/Conversion-Step 10 bit 10 MS/s Asynchronous SAR ADC in 0.18 μm CMOS", 2010 Symposium on VLSI Circuits/Technical Digest of Technical Papers.

Figure 6A:
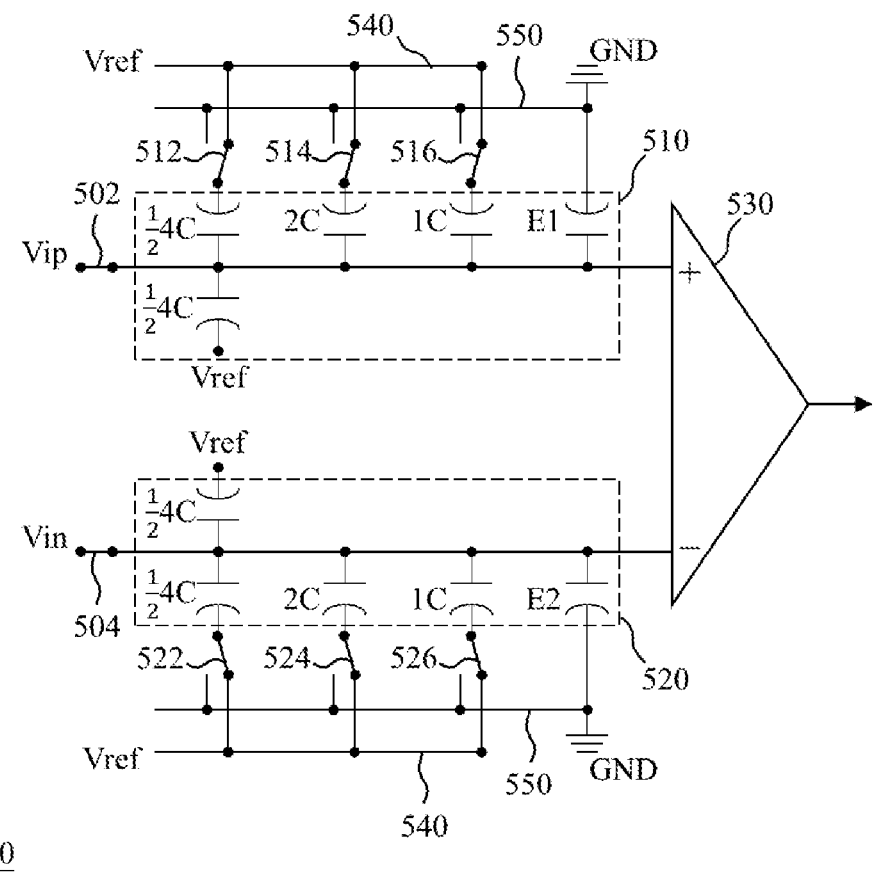
FIG. 6a shows a partial circuit diagram of a DAC IC using the capacitor layout of FIG. 3 according to another embodiment of the present invention.
Figure 6B:
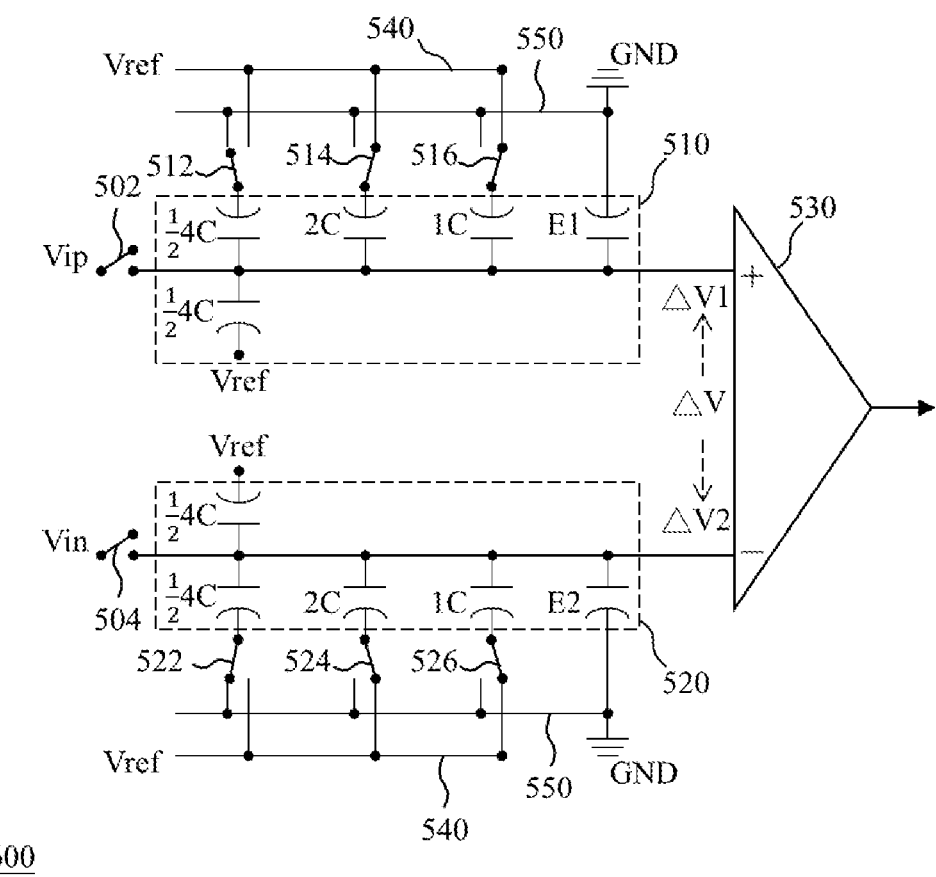
FIG. 6b shows the circuit of FIG. 6a executing a switching operation to generate a signal approaching a differential signal.

In light of the above, in order to reduce the significance of the error $\Delta V1_{error}$, the present invention can optionally use a fully differential switching algorithm. FIG. 6a shows a partial circuit diagram of a DAC IC using the capacitor layout 300 of FIG. 3 according to another embodiment of the present invention. In comparison with FIG. 5a, in the DAC IC 600 of FIG. 6a, the capacitor group 4C of the first capacitor-group set 510 is equally divided into two parts ½4C and ½4C, and one of the two parts is directly coupled to the reference voltage supply circuit 540 or the ground voltage supply circuit 550 through the switch 512; the capacitor group 4C of the second capacitor-group set 520 is equally divided into two parts ½4C and ½4C, and one of the two parts is directly coupled to the reference voltage supply circuit 540 or the ground voltage supply circuit 550 through the switch 522. FIG. 6b shows the circuit of FIG. 6a executing a switching operation once to generate a signal approaching the differential signal. As shown in FIG. 6b, based on an amplitude of the differential signal (e.g., an amplitude slightly larger than the amplitude of an analog signal equivalent to a binary digital value "100") and the fully differential switching algorithm, if the switches 502, 504 performs disconnection to stop sampling the differential signal, both the switches 512, 522 are decoupled from the reference voltage supply circuit 540 and coupled to the ground voltage supply circuit 550 according to a former comparison result while the other switches keep being coupled to the reference voltage supply circuit 540. In consideration of charge conservation, the voltage variation $\Delta V1$ at the positive input terminal of the comparator 530 and the voltage variation $\Delta V2$ at the negative input terminal of the comparator 530 are as follows:

$$\Delta V1 = \frac{2C}{(4C+2C+1C+E1C)}(Vref-0)$$

$$\Delta V2 = \frac{2C}{(4C+2C+1C+E2C)}(0\ Vref)$$

For the comparator 530 of FIG. 6b, the variation of the voltage difference $\Delta V$ between the positive input terminal and the negative input terminal is $(\Delta V1-\Delta V2)$ that is approximately $\Delta V1$ of FIG. 5a. Since the capacitor groups $E_1$, $E_2$ are located at the edge of the capacitor layout 300 and vulnerable to the influence of uneven layout, providing the ideal capacitance of each of the capacitor groups $E_1$, $E_2$ is 4C and the actual capacitance of each of the capacitor groups $E_1$, $E_2$ is 5C, the error $\Delta V_{error}$ $$\left(i.e., \frac{actual\ \Delta V}{ideal\ \Delta V}-1 = \frac{actual\ \Delta V1 - actual\ \Delta V2}{ideal\ \Delta V1 - ideal\ \Delta V2}-1\right)$$

of $\Delta V$ is as follows:

$$\Delta V_{error} = \frac{\frac{2C}{(7C+3C)}(Vref-0)-\frac{2C}{(7C+5C)}(0-Vref)}{\frac{2C}{(7C+4C)}(Vref-0)-\frac{2C}{(7C+4C)}(0-Vref)}-1 \approx 0.83\%$$

In light of the above, providing the capacitor groups 4C are dominant in determining the MSB of the DAC IC, the error $\Delta V_{error}$ will be the maximum error for executing the switching operation one time. As a result, the present invention can further reduce the influence caused by the capacitance variance of the capacitor group(s) at the edge of the capacitor layout 300 by adopting a circuitry structure of the fully differential switching algorithm. In comparison with the error $\Delta V1_{error}=10\%$ of FIG. 5b adopting the circuitry structure of the set-and-down switching algorithm, the error $\Delta V_{error}$ of FIG. 6b adopting the circuitry structure of the fully differential switching algorithm is merely 0.83%. Since those of ordinary skill in the art can appreciate how to derive $\Delta V1$, $\Delta V2$, $\Delta V$ and $\Delta V_{error}$ of other instances (e.g., instances with the differential signal of other amplitudes, instances with other amounts of capacitor groups, instances with capacitor groups having other capacitance, and/or instances with the lower circuit 320 being coupled to other reference voltage(s)) from the present disclosure, repeated and redundant description is omitted here. It should be noted that the fully differential switching algorithm is well known in this industrial field as mentioned in the following literature: Chun-Cheng Liu, et al., "A 1V 11fJ/Conversion-Step 10 bit 10 MS/s Asynchronous SAR ADC in 0.18 μm CMOS", 2010 Symposium on VLSI Circuits/Technical Digest of Technical Papers.

It should be noted that in the embodiments of FIG. 5b and FIG. 6b, each of the other capacitor groups (i.e., the capacitor groups 2C and the capacitor groups 1C) can adopt a circuitry structure of the fully differential switching algorithm or a circuitry structure of the set-and-down switching algorithm. Since the capacitance of each of these capacitor groups is insignificant in comparison with the capacitance of the capacitor groups 4C (or the capacitor group(s) dominant in determining the MSB), the influence of these capacitor groups using the set-and-down switching algorithm is relatively minor. In an alternative embodiment of the present invention, each of K capacitor group(s) dominant in determining K most significant bit(s) (e.g., three or more bits) of a DAC IC adopts a circuitry structure of the fully differential switching algorithm while each of the other capacitor group(s) for determining the other bit(s) of the DAC IC adopts a circuitry structure of the set-and-down switching algorithm; and people of ordinary skill in the art can appreciate how to derive the above-mentioned alternative embodiment and similar embodiments from the present disclosure.

In each of the aforementioned embodiments, the number of the capacitor units of the capacitor group (i.e., the capacitor group E) at the edge of the capacitor layout 300 is not less than the number of the capacitor units of any capacitor group at the inside of the capacitor layout 300 (i.e., within the interior layout area 302). In an alternative embodiment of the present invention, the number of capacitor units in a capacitor group (e.g., the capacitor group E of FIG. 3) functioning as a substantial capacitor at the edge of the capacitor layout is not less than the number of capacitor units in a capacitor group (e.g., the capacitor group 4C of FIG. 3) dominant in determining the MSB, and this is obviously different from the teaching of the prior art. In addition, a ratio of the number of capacitor units (or a capacitance ratio) of a capacitor group in the interior layout area 302 to the number of capacitor units (or a capacitance ratio) of another capacitor group in the interior layout area 302 is $2^Y$, in which the Y is a positive integer; however, the said ratio could be a number other than $2^Y$ in an alternative embodiment. It should be noted that if an implementation derived from one or more of the aforementioned embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

To sum up, the capacitor layout of the present invention is applicable to a DAC IC. The DAC IC using the capacitor layout of the present invention is superior in linearity (i.e., having lower DNL or lower INL) in comparison with the prior art.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A capacitor layout of a digital-to-analog conversion integrated circuit (DAC IC), the capacitor layout of the DAC IC comprising:
    a plurality of capacitor groups including:
    a first capacitor group being dominant in determining a first bit of the DAC IC, the first capacitor group including M first capacitance units that are coupled between a first upper circuit and a first lower circuit and located within an interior layout area of the capacitor layout of the DAC IC, in which the M is an integer greater than one;
    a second capacitor group for determining a second bit of the DAC IC, the second capacitor group including N second capacitance unit(s) that are coupled between a second upper circuit and a second lower circuit and located within the interior layout area, in which the N is a positive integer; and a third capacitor group including X third capacitance units that are coupled between a third upper circuit and a third lower circuit, in which the third upper circuit and the third lower circuit are not short-circuited, the X third capacitance units are located outside the interior layout area and disposed next a plurality of sides of the interior layout area, and the X is an integer greater than one, wherein the first bit is a most significant bit of the DAC IC, a number of capacitance units of the third capacitor group is not less than a number of capacitance units of the first capacitor group, and a capacitance of the third capacitor group is less than a capacitance of the first capacitor group.

2. The capacitor layout of the DAC IC of claim 1, wherein the first upper circuit, the second upper circuit and the third upper circuit are configured to receive an alternating current input signal; the first lower circuit is configured to supply a first reference voltage, the second lower circuit is configured to supply a second reference voltage, and the third lower circuit is configured to supply a third reference voltage; the first capacitor group is coupled to the first lower circuit through at least one first switch(es) according to a first switching algorithm; and the second capacitor group is coupled to the second lower circuit through at least one second switch(es) according to the first switching algorithm or a second switching algorithm.

3. The capacitor layout of the DAC IC of claim 2, wherein the first switching algorithm is a fully differential switching algorithm, and the second switching algorithm is a set-and-down switching algorithm.

4. The capacitor layout of the DAC IC of claim 1, wherein the first upper circuit, the second upper circuit and the third upper circuit are configured to receive an alternating current input signal; the first capacitor group is coupled to the first lower circuit through at least one first switch(es); the second capacitor group is coupled to the second lower circuit through at least one second switch(es); and the third capacitor group is directly coupled to the third lower circuit through no switch.

5. The capacitor layout of the DAC IC of claim 1, wherein the number of the capacitance units of the third capacitor group is more than the number of the capacitance units of the first capacitor group.

6. The capacitor layout of the DAC IC of claim 1, wherein the X third capacitance units are disposed on at least two sides of the interior layout area.

7. The capacitor layout of the DAC IC of claim 1, wherein the third capacitor group is disposed around the interior layout area.

8. The capacitor layout of the DAC IC of claim 1, further comprising dummy capacitors.

9. The capacitor layout of the DAC IC of claim 1, wherein a ratio of a capacitance value of the first capacitor group to a capacitance value of the second capacitor group is $2^Y$, in which the Y is a positive integer.

10. The capacitor layout of the DAC IC of claim 1, wherein the first lower circuit and the second lower circuit include a low voltage supply terminal, the third lower circuit includes a voltage terminal, and the low voltage supply terminal is different from the voltage terminal.

11. A capacitor layout of a digital-to-analog conversion integrated circuit (DAC IC), the capacitor layout of the DAC IC comprising:

a plurality of capacitor groups including:

a first capacitor group being dominant in determining a first bit of the DAC IC, in which the first capacitor group is coupled between a first upper circuit and a first lower circuit and located within an interior layout area of the capacitor layout of the DAC IC;

a second capacitor group for determining a second bit of the DAC IC, in which the second capacitor group is coupled between a second upper circuit and a second lower circuit and located within the interior layout area; and a third capacitor group coupled between a third upper circuit and a third lower circuit, in which the third upper circuit and the third lower circuit are not short-circuited, and the third capacitor group is located outside the interior layout area and disposed next a plurality of sides of the interior layout area, wherein the first lower circuit and the second lower circuit include a low voltage supply terminal, the third lower circuit includes a voltage terminal, and the low voltage supply terminal is different from the voltage terminal.

12. The capacitor layout of the DAC IC of claim 11, wherein the first upper circuit, the second upper circuit and the third upper circuit are configured to receive an alternating current input signal; the first lower circuit is configured to supply a first reference voltage, the second lower circuit is configured to supply a second reference voltage, and the third lower circuit is configured to supply a third reference voltage; the first capacitor group is coupled to the first lower circuit through at least one first switch(es) according to a first switching algorithm; and the second capacitor group is coupled to the second lower circuit through at least one second switch(es) according to a second switching algorithm.

13. The capacitor layout of the DAC IC of claim 12, wherein the first switching algorithm is a fully differential switching algorithm, and the second switching algorithm is a set-and-down switching algorithm.

14. The capacitor layout of the DAC IC of claim 11, wherein the first upper circuit, the second upper circuit and the third upper circuit are configured to receive an alternating current input signal; the first capacitor group is coupled to the first lower circuit through at least one first switch(es); the second capacitor group is coupled to the second lower circuit through at least one second switch(es); and the third capacitor group is directly coupled to the third lower circuit through no switch.

15. The capacitor layout of the DAC IC of claim 11, wherein the third capacitor group is disposed on at least two sides of the interior layout area.

16. The capacitor layout of the DAC IC of claim 11, wherein the third capacitor group is disposed around the interior layout area.

17. The capacitor layout of the DAC IC of claim 11, further comprising dummy capacitors.

18. The capacitor layout of the DAC IC of claim 11, wherein the first bit is a most significant bit of the DAC IC, a number of capacitance units of the third capacitor group is not less than a number of capacitance units of the first capacitor group, and a capacitance of the third capacitor group is less than a capacitance of the first capacitor group.

19. A capacitor layout of a digital-to-analog conversion integrated circuit (DAC IC), the capacitor layout of the DAC IC comprising:
- a plurality of capacitor groups including:
  - a first capacitor group being dominant in determining a first bit of the DAC IC, in which the first capacitor group is coupled between a first upper circuit and a first lower circuit and located within an interior layout area of the capacitor layout of the DAC IC;
  - a second capacitor group for determining a second bit of the DAC IC, in which the second capacitor group is coupled between a second upper circuit and a second lower circuit and located within the interior layout area; and
  - a third capacitor group coupled between a third upper circuit and a third lower circuit, in which the third upper circuit and the third lower circuit are not short-circuited, and the third capacitor group is located outside the interior layout area and disposed next a plurality of sides of the interior layout area; and
- dummy capacitors.

20. The capacitor layout of the DAC IC of claim 19, wherein the first bit is a most significant bit of the DAC IC, a number of capacitor units of the third capacitor group is not less than a number of capacitor units of the first capacitor group, and a capacitance of the third capacitor group is less or greater than a capacitance of the first capacitor group.

* * * * *